United States Patent
Komura et al.

(10) Patent No.: US 6,490,215 B2
(45) Date of Patent: Dec. 3, 2002

(54) SEMICONDUCTOR MEMORY DEVICE AND REFRESHING METHOD OF SEMICONDUCTOR MEMORY DEVICE

(75) Inventors: Kazufumi Komura, Kasugai (JP); Takaaki Furuyama, Kasugai (JP); Satoru Kawamoto, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/861,545

(22) Filed: May 22, 2001

(65) Prior Publication Data

US 2001/0043499 A1 Nov. 22, 2001

(30) Foreign Application Priority Data

May 22, 2000 (JP) .......................................... 2000-149237

(51) Int. Cl.[7] .................................................. G11C 7/00
(52) U.S. Cl. ..................... 365/222; 365/236; 365/230.01
(58) Field of Search ............................. 365/222, 230.03, 365/191, 230.01, 230.08, 236, 189.05

(56) References Cited

U.S. PATENT DOCUMENTS 5,999,474 A * 12/1999 Leung et al. ................ 365/222
6,298,413 B1 * 10/2001 Christenson ................ 711/106
2001/0007538 A1 * 7/2001 Leung ........................ 365/222

* cited by examiner

Primary Examiner—David Nelms
Assistant Examiner—Thong Le
(74) Attorney, Agent, or Firm—Arent Fox Kintner Plotkin Kahn

(57) ABSTRACT

A semiconductor memory device that suppresses an increase in the circuit area which is originated from the layout of address signal lines. The semiconductor memory device includes refresh address counters, a switch circuit, and address holding circuits. The refresh address counters generate refresh address signals associated with banks in response to a refresh request signal. The switch circuit selectively outputs the external address signal and a refresh address signal generated by one of the refresh address counters in accordance with the refresh request signal. Each of the address holding circuits holds the refresh address signal or the external address signal output from the switch circuit and supplies the held address signal to an associated one of the banks.

15 Claims, 16 Drawing Sheets

SEMICONDUCTOR MEMORY DEVICE AND REFRESHING METHOD OF SEMICONDUCTOR MEMORY DEVICE

BACKGROUND OF THE INVENTION

The present invention relates to a semiconductor memory device having a plurality of banks, and, more particularly, to a semiconductor memory device which performs write and read operations on a selected bank and a refresh operation on non-selected banks in parallel.

The recent achievement of larger capacity and a greater number of bits demands the use of DRAMs each of which has a plurality of banks mounted on a same semiconductor substrate and performs write and read operations on a selected bank and a refresh operation on non-selected banks in parallel.

FIG. 1 is a schematic block diagram of a synchronous DRAM (SDRAM) 100 according to the prior art. The SDRAM 100 includes a plurality of banks MB0 to MBn mounted on a semiconductor substrate. The SDRAM 100 is independently accessable by the individual banks, so that each bank operates as an independent DRAM.

Each of the banks MB0–MBn includes a memory cell array having a plurality of memory cells, a memory cell select circuit which selects memory cells in accordance with an address signal, a data write circuit which writes cell information in selected memory cells and a data read circuit which reads cell information from selected memory cells.

The SDRAM 100 further includes refresh address counters RC0 to RCn corresponding to the banks MB0–MBn and a switch circuit SW1 connected between the refresh address counters RC0–RCn and the banks MB0–MBn. Every time the refresh address counters RC0–RCn receive a refresh request signal RQ, they generate refresh address signals RA00 to RA09, RA10 to RA19, and RAn0 to RAn9 of, for example, 10 bits corresponding to the banks MB0–MBn, through a count-up operation, and provide the refresh address signals to the switch circuit SW1.

The switch circuit SW1 receives external address signals EA0 to EA9 and bank control signals BC0 to BCn from external circuits and supplies address signals A00 to A09, A10 to A19, and An0 to An9 to the respective banks MB0–MBn via ten respective signal lines. The external address signals EA0–EA9 are used to perform a write operation or read operation with respect to the banks MB0–MBn. The bank control signals BC0–BCn are used to select any bank on which a write operation or read operation is to be performed.

The switch circuit SW1 selects, for example, the address signals A00–A09 provided to the bank MB0 from the external address signals EA0–EA9 and the refresh address signals RA00–RA09. Likewise, the switch circuit SW1 selects the address signals A10–A19 provided to the bank MB1 from the external address signals EA0–EA9 and the refresh address signals RA10–RA19. Further, the switch circuit SW1 selects the address signals An0–An9 provided to the bank MBn from the external address signals EA0–EA9 and the refresh address signals RAn0–RAn9.

The operation of the SDRAM 100 will be discussed referring to FIG. 2. The individual banks MB0–MBn operate in synchrony with an external clock signal CLK. When an active signal ACTV is provided to the bank MB0 at a first timing t1 and the bank control signal BC0 is provided to the switch circuit SW1, for example, the switch circuit SW1 selects the external address signals EA0–EA9 and provides the selected external address signals (address signals A00–A09) to the bank MB0. The bank MB0 is enabled by the active signal ACTV and executes a write operation or a read operation in accordance with the external address signals EA0–EA9.

At the same time, the refresh request signal RQ is provided to each of the refresh address counters RC0–RCn. Each of the refresh address counters RC0–RCn performs the count-up operation and provides a refresh address signal to the switch circuit SW1.

The switch circuit SW1 provides refresh address signals (address signals A10–A19, An0–An9) to the non-selected banks MB1–MBn to perform a refresh operation of the cell information.

When the active signal ACTV is provided to the bank MB1 at a second time t2 and the bank control signal BC1 is provided to the switch circuit SW1, the switch circuit SW1 provides the external address signals EA0–EA9 (address signals A10–A19) to the bank MB1. The bank MB1 is enabled by the active signal ACTV and performs a write operation or a read operation in accordance with the external address signals EA0–EA9.

At the same time, the switch circuit SW1 respectively provides refresh address signals to the non-selected banks MB0 and MB2–MBn to refresh cell information. Thereafter, such a write operation or a read operation and refresh operation are repeated.

When a self-refresh command is provided to the individual banks MB0–MBn, the refresh request signal RQ which is generated within the chip is provided to the individual refresh address counters RC0–RCn. Then, the refresh address signals provided from the refresh address counters RC0–RCn are provided to the respective banks MB0–MBn via the switch circuit SW1, and all of the banks MB0–MBn perform a refresh operation simultaneously.

The SDRAM 100 requires that the same number of address signal lines as the number of bits of the address signals should be laid between the switch circuit SW1 and the banks MB0–MBn. As the number of banks increases, therefore, the number of address signal lines increases. This results in an inevitable increase in the layout area for the address signal lines, thus increasing the area of the SDRAM 100.

Since the write operation or read operation of a selected bank and the refresh operation of non-selected banks are executed simultaneously, the peak of the consumed current of the entire device is relatively high.

When a self-refresh command is provided to each of the banks MB0–MBn, all of the banks perform the refresh operation simultaneously. The peak of the operational current in this case is relatively high. To supply the current in a stable manner, even at the time of such a peak, the power lines should have a relatively wide width. This also increases the area of the SDRAM 100.

No refresh operation is needed for any bank that has just finished a write operation or a read operation in accordance with the external address signals EA0–EA9. However, a bank that just finished a write operation or a read operation together with the other non-selected banks actually do undergo a refresh operation. This means that the bank consumes a wasteful current. In other words, the overall consumed current of the SDRAM 100 increases.

SUMMARY OF THE INVENTION

Accordingly, it is a first object of the present invention to provide a semiconductor memory device that suppresses an increase in the circuit area which is originated from the layout of address signal lines.

It is a second object of the invention to provide a semiconductor memory device which suppresses the peak of the operational current of each bank, thus reducing the overall consumed current.

In one aspect of the present invention, there is provided a semiconductor memory device including a plurality of banks, a plurality of refresh address counters, a switch circuit, and a plurality of address holding circuits. Each of the plurality of banks performs a write operation and read operation according to an external address signal and a refresh operation according to a refresh address signal. The plurality of refresh address counters generate a plurality of refresh address signals associated with the plurality of banks in response to a refresh request signal. The switch circuit is connected to the plurality of refresh address counters and selectively outputs the external address signal and a refresh address signal generated by one of the plurality of refresh address counters in accordance with the refresh request signal. Each of the plurality of address holding circuits is connected between the switch circuit and the plurality of banks, holds one of the refresh address signals and the external address signal outputs from the switch circuit, and supplies the held address signal to an associated one of the banks.

In another aspect of the present invention, there is provided a method of refreshing a semiconductor memory device having a plurality of banks. The method includes generating a plurality of refresh address signals associated with the plurality of banks, supplying the plurality of refresh address signals in a time-divisional manner, holding a refresh address signal to be provided to an associated one of the banks, and refreshing the associated one of the banks in accordance with the held refresh address signal.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
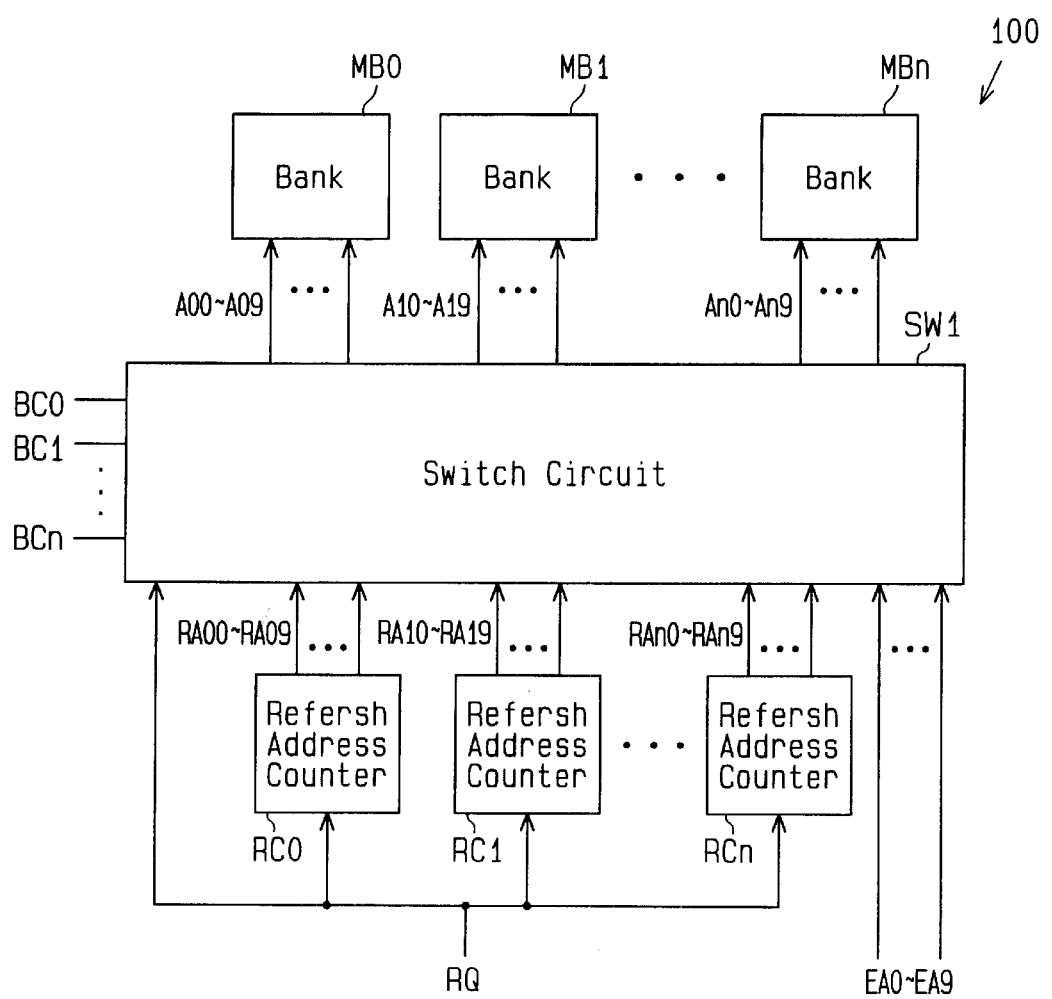
FIG. 1 is a schematic block diagram of an SDRAM according to an example in the prior art.
Figure 2:
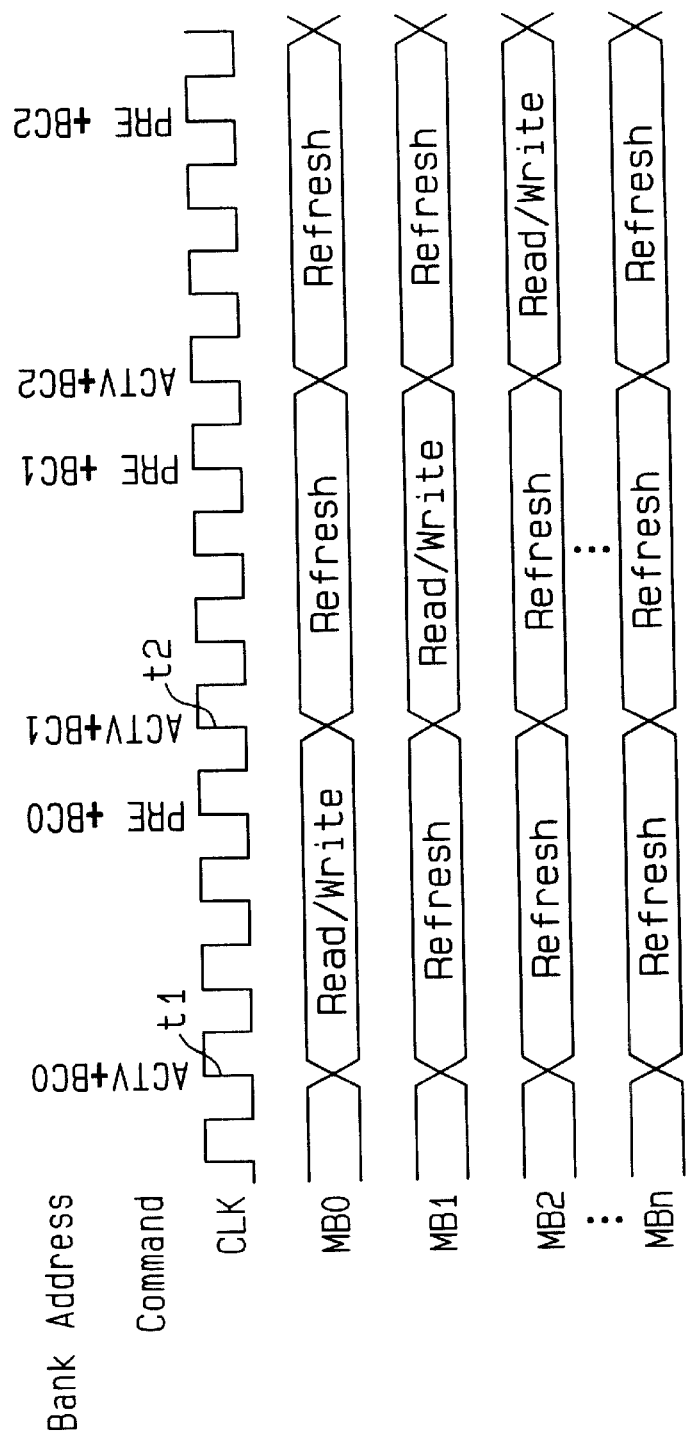
FIG. 2 is a timing waveform chart showing the operation of the SDRAM of FIG. 1.

In the drawings, like numerals are used for like elements throughout.

Figure 3:
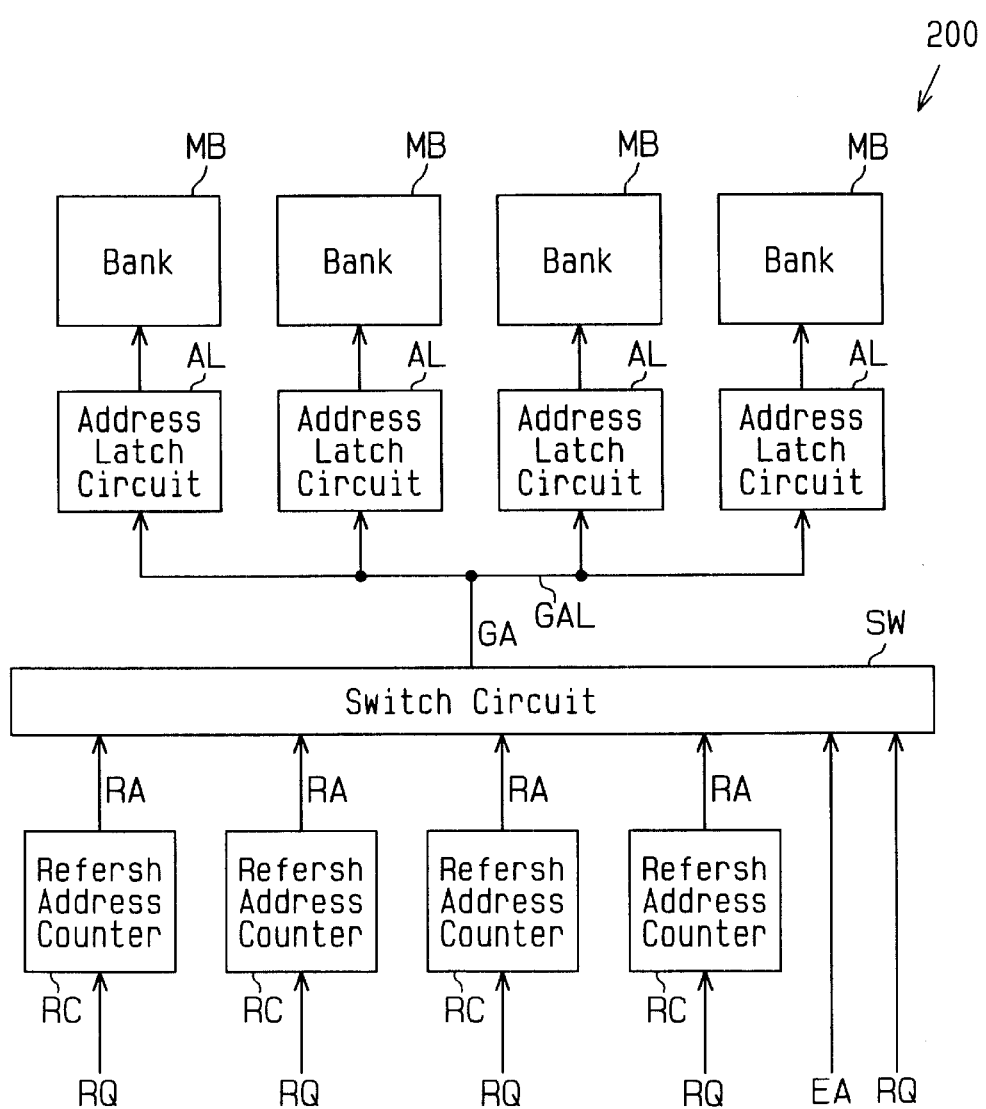
FIG. 3 is a schematic block diagram of an SDRAM according to a first embodiment of the present invention.

FIG. 3 is a schematic block diagram of a semiconductor memory device 200 according to a first embodiment of the present invention. The semiconductor memory device 200 accesses a plurality of banks MB for operations to write and read cell information in accordance with an external address signal EA and for an operation to refresh cell information in accordance with a refresh address signal RA in parallel. A plurality of refresh address counters RC are provided in association with the respective banks MB. Each refresh counter generates a refresh address signal RA to be provided to the associated bank MB in response to a refresh request signal RQ. In response to the refresh request signal RQ, a switch circuit SW selects either the external address signal EA or the refresh address signal RA and outputs the selected address signal. The semiconductor memory device 200 has a plurality of address latch circuits AL connected between the switch circuit SW and the banks MB by a common address signal line GAL. Each address latch circuit AL is provided with the external address signal EA or the refresh address signal RA as a common address signal GA from the switch circuit SW. Each address latch circuit AL latches the common address signal GA for the associated bank MB and provides the latched common address signal GA to the associated bank MB. The switch circuit SW supplies the individual banks MB with the associated refresh address signals RA in a time-divisional manner. Each address latch circuit AL latches the refresh address signal RA to be provided to the associated bank MB from the time-divisionally output refresh address signals RA.

Figure 4:
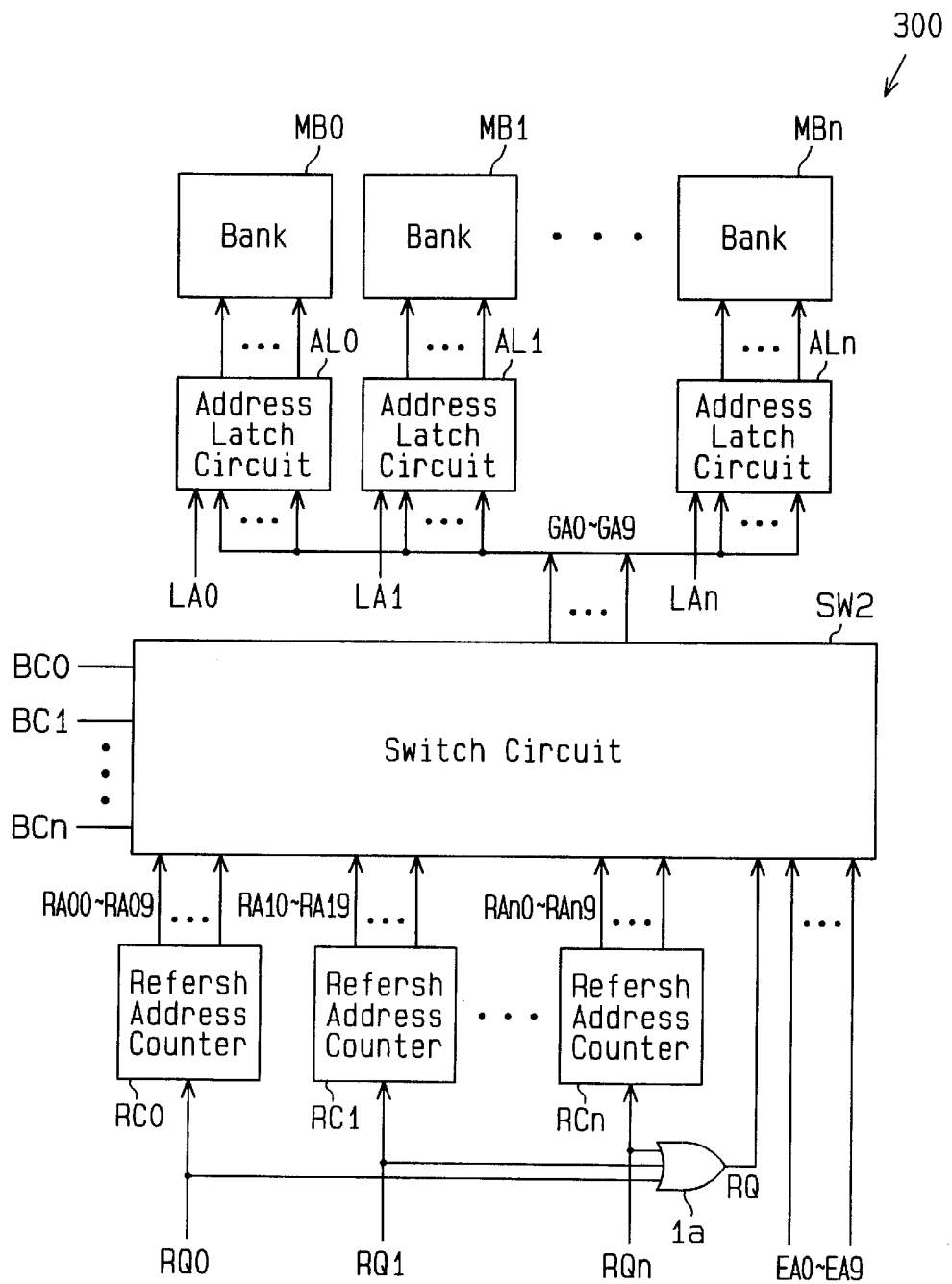
FIG. 4 is a schematic block diagram of an SDRAM according to a second embodiment of the present invention.

FIG. 4 is a schematic block diagram of an SDRAM 300 according to a second embodiment of the present invention. The SDRAM 300 includes a plurality of banks MB0 to MBn, a plurality of refresh address counters RC0 to RCn associated with the banks MB0–MBn, a switch circuit SW2 and a plurality of address latch circuits AL0 to ALn associated with the banks MB0–MBn.

The refresh address counters RC0–RCn are provided with refresh request signals RQ0 to RQn, respectively. Every time the refresh address counters RC0–RCn receive the respective refresh request signals RQ0–RQn, the refresh address counters RC0–RCn generate refresh address signals RA00 to RA09, RA10 to RA19, and RAn0 to RAn9 through a count-up operation, and provide the refresh address signals to the switch circuit SW2.

The refresh request signals RQ0–RQn are provided to an OR gate 1a, which performs an OR operation on the refresh request signals RQ0–RQn. The OR gate 1a provides a resultant refresh request signal RQ to the switch circuit SW2. The switch circuit SW2 is also provided with external address signals EA0 to EA9 and bank control signals BC0 to BCn.

The address latch circuits AL0–ALn are arranged near the respective banks MB0–MBn. The address latch circuits AL0–ALn are connected to the switch circuit SW2 by a common address signal line. The switch circuit SW2 supplies the address latch circuits AL0–ALn with common address signals GA0 to GA9 common to the individual banks.

In response to address latch signals LA0 to LAn, the respective address latch circuits AL0–ALn latch the common address signals GA0–GA9 and provide the latched common address signals GA0–GA9 to the respective banks MB0–MBn.

Figure 5:
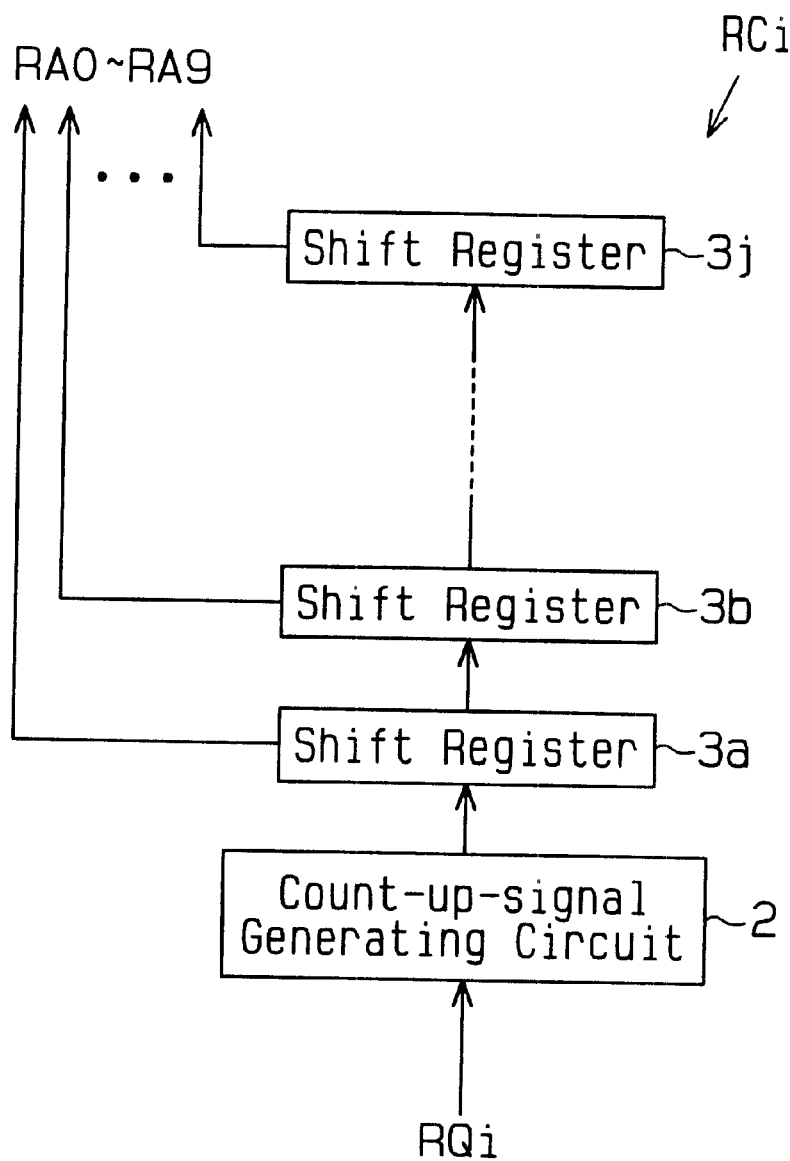
FIG. 5 is a schematic block diagram of a refresh address counter of the SDRAM of FIG. 4.

As shown in FIG. 5, each refresh address counter RCi (RCi indicates one of RC0 to RCn) includes a count-up-signal generating circuit 2 and ten series-connected shift registers 3a to 3j.

The count-up-signal generating circuit 2 receives the refresh request signal RQi and provides a count-up signal to the first shift register 3a in response to the refresh request signal RQi.

When the count-up signal is provided to the first shift register 3a, the ten shift registers 3a–3j perform a count-up operation and output the refresh address signals RA00–RA09 of 10 bits.

Figure 6:
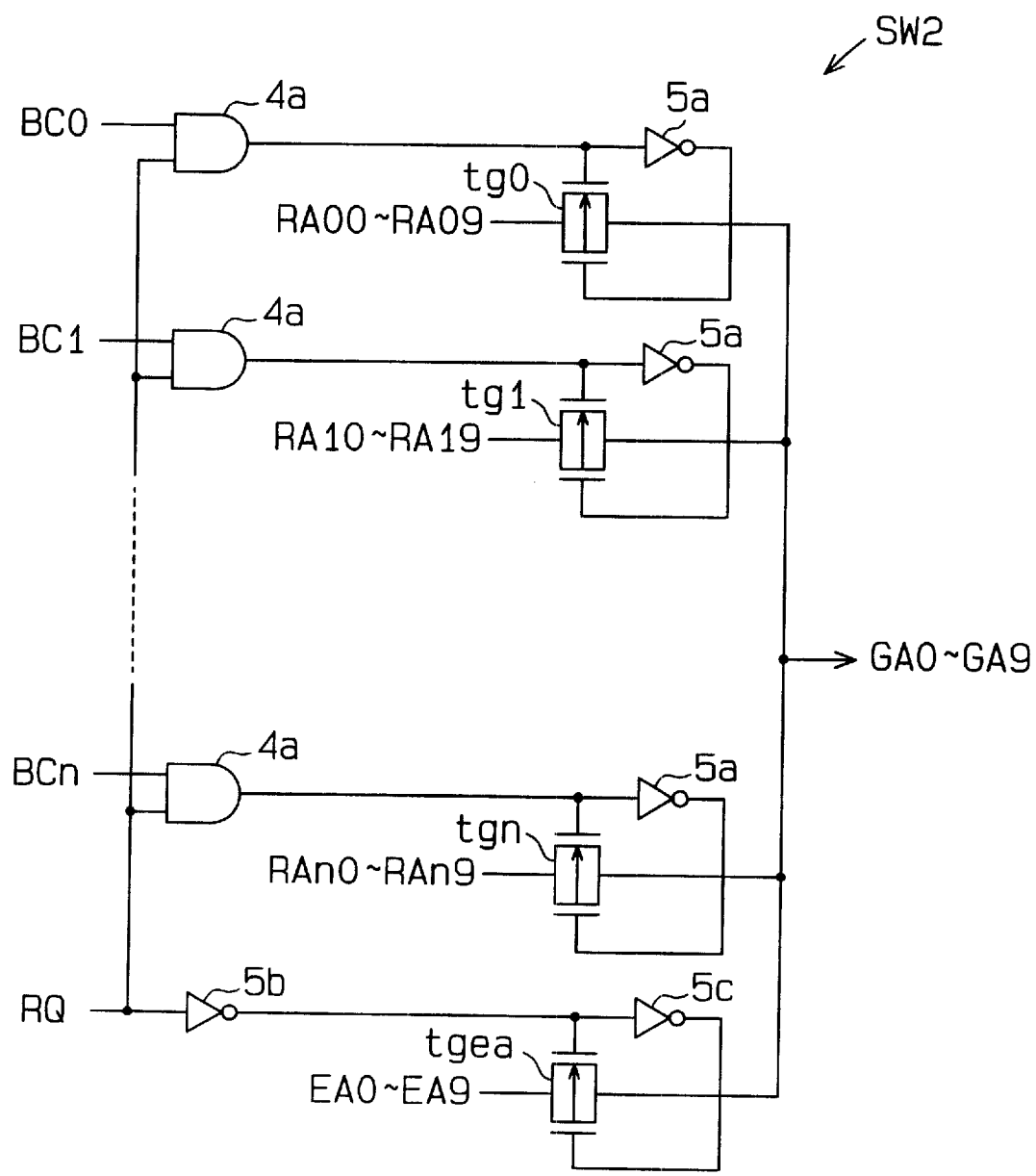
FIG. 6 is a schematic circuit diagram of a switch circuit of the SDRAM of FIG. 4.

As shown in FIG. 6, the switch circuit SW2 includes AND gates 4a corresponding in number to the bank control signals BC0–BCn. Each AND gate 4a has a first input terminal for receiving the associated bank control signal and a second input terminal for receiving the refresh request signal RQ.

AND logic output signals from the AND gates 4a are provided to the N-channel gates of transfer gates tg0 to tgn and to the P-channel gates of the transfer gates tg0–tgn via inverter circuits 5a. When the AND logic output signal has a high level, each of the transfer gates tg0–tgn is enabled, and when the AND logic output signal has a low level, each of the transfer gates tg0–tgn is disabled.

The transfer gates tg0–tgn are respectively provided with the refresh address signals RA00–RA09, RA10–RA19 and RAn0–RAn9 from the refresh address counters RC0–RCn.

The refresh request signal RQ is provided to the N-channel gate of a transfer gate tgea via an inverter circuit 5b and to the P-channel gate of the transfer gate tgea via the inverter circuits 5b and another inverter circuit 5c.

The transfer gate tgea is provided with the external address signals EA0–EA9.

Although FIG. 6 illustrates a single transfer gate tg0–tgn and tgea for each AND gate 4a or the inverter circuit 5b, there are actually ten transfer gates that receive and output address signals of 10 bits in parallel.

The output terminals of the transfer gates tg0–tgn and tgea are connected to a common address signal line to which the 10-bit common address signals GA0–GA9 are provided from one of the transfer gates tg0–tgn and tgea.

In response to the high-level refresh request signal RQ, the transfer gate tgea is disabled. When one of the bank control signals BC0–BCn has a high level, one of the AND gates 4a outputs a high-level AND logic output signal. In response to a high-level bank control signal (high-level AND logic output signal), only one of the transfer gates tg0–tgn is enabled and the refresh address signal is output via the enabled transfer gate as the common address signals GA0–GA9.

When the refresh request signal RQ goes low, the individual AND gates 4a output low-level AND logic output signals, thus disabling the transfer gates tg0–tgn. The inverter circuit 5b outputs a high-level signal, thus enabling the transfer gate tgea. Accordingly, the external address signals EA0–EA9 are outputted as the common address signals GA0–GA9.

Figure 7:
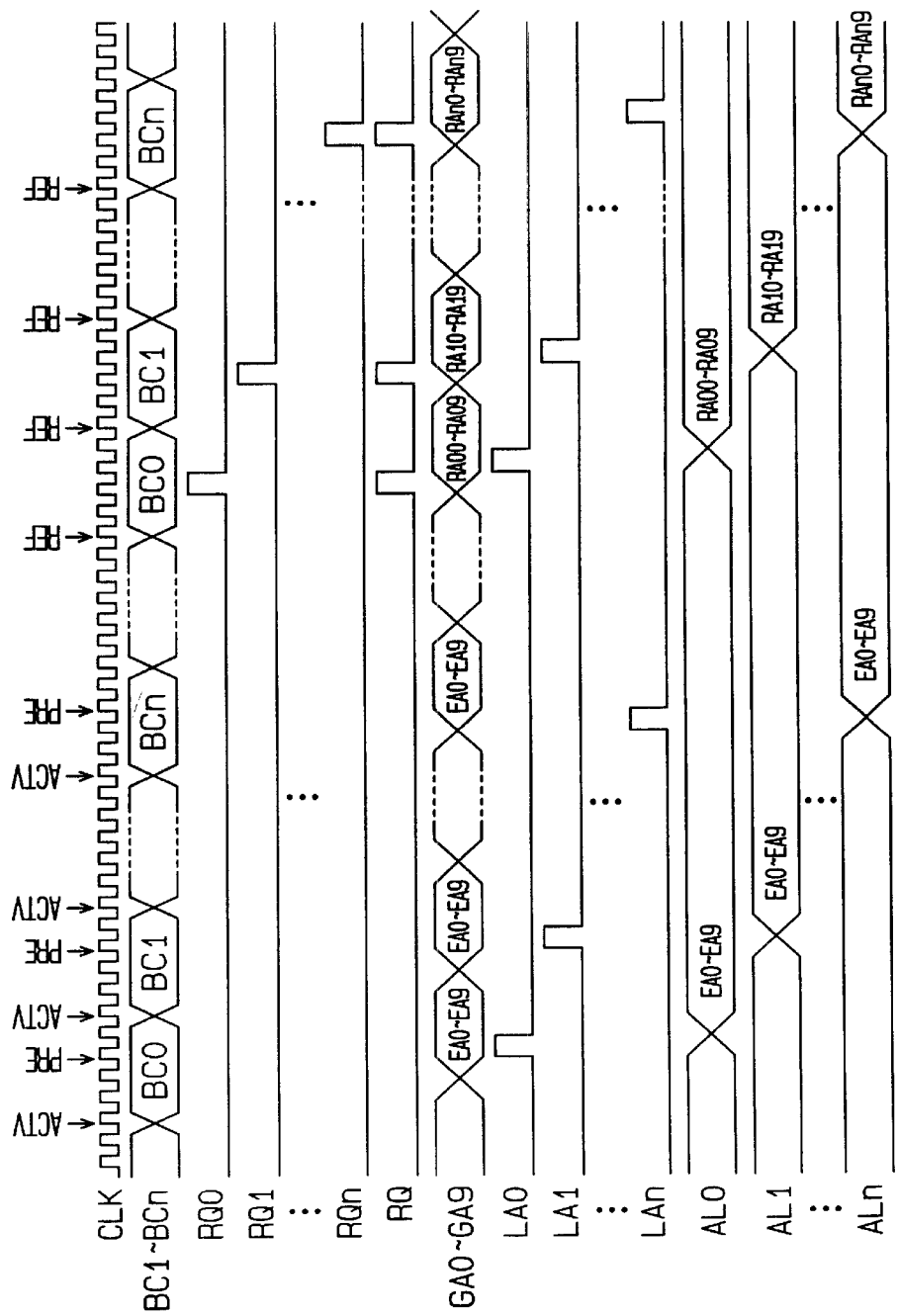
FIG. 7 is a timing waveform chart showing the operation of the SDRAM of FIG. 4.

The operation of the SDRAM 300 will now be discussed. FIG. 7 illustrates the operation of the SDRAM 300 in the case where the refresh operation of the banks MB0–MBn is executed following the write operation or read operation of the banks MB0–MBn.

When the bank control signal BC0 is provided to the switch circuit SW2 based on an active command ACTV that enables the bank MB0, the switch circuit SW2 outputs the external address signals EA0–EA9. When the address latch signal LA0 is provided to the address latch circuit AL0 under the situation, the address latch circuit AL0 latches the external address signals EA0–EA9. In this manner, the bank MB0 performs a write operation or read operation in accordance with the external address signals EA0–EA9.

When the bank control signal BC1 is provided to the switch circuit SW2 based on an active command ACTV that enables the bank MB1, the switch circuit SW2 outputs the external address signals EA0–EA9. When the address latch signal LA1 is provided to the address latch circuit AL1 under the situation, the address latch circuit AL1 latches the external address signals EA0–EA9. In this manner, the bank MB1 performs a write operation or read operation in accordance with the external address signals EA0–EA9. At this time, the address latch circuit AL0 maintain the external address signals EA0–EA9 latched. As the individual banks are sequentially enabled, a write operation or read operation is performed.

A command PRE in FIG. 7 is used to reset the word line and bit line that have been selected for a write operation and read operation.

When the bank control signal BC0 is provided to the switch circuit SW2 followed with the supply of the refresh request signal RQ0 based on a refresh command REF for the bank MB0, the refresh address counter RC0 provides the refresh address signals RA00–RA09 to the switch circuit SW2 and the OR gate 1a supplies the refresh request signal RQ to the switch circuit SW2. In response to the refresh request signal RQ, the switch circuit SW2 outputs the refresh address signals RA00–RA09. When the address latch signal LA0 is provided to the address latch circuit AL0 under this situation, the address latch circuit AL0 latches the refresh address signals RA00–RA09. Accordingly, the bank MB0 performs a refresh operation in accordance with the refresh address signals RA00–RA09.

When the bank control signal BC1 is provided to the switch circuit SW2 followed with the supply of the refresh request signal RQ1 based on a refresh command REF for the bank MB1, the refresh address counter RC1 provides the refresh address signals RA10–RA19 to the switch circuit SW2 and the OR gate 1a supplies the refresh request signal RQ to the switch circuit SW2. In response to the refresh request signal RQ, the switch circuit SW2 outputs the refresh address signals RA10–RA19. When the address latch signal LA1 is provided to the address latch circuit AL1 under this situation, the address latch circuit AL1 latches the refresh address signals RA10–RA19. Accordingly, the bank MB1 performs a refresh operation in accordance with the refresh address signals RA10–RA19. In this manner, the individual banks MB0–MBn sequentially perform a refresh operation.

Figure 8:
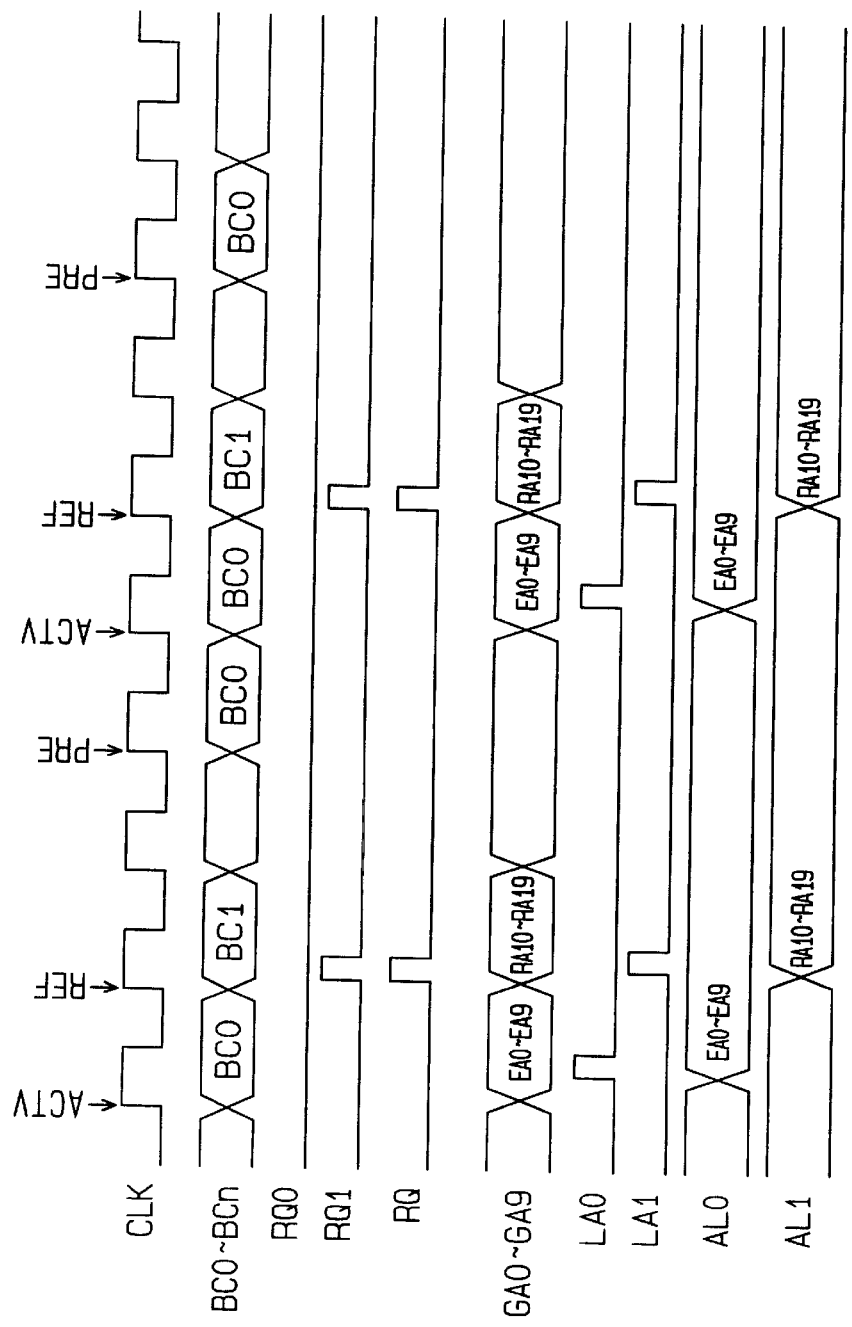
FIG. 8 is a timing waveform chart showing the operation of the SDRAM of FIG. 4.

With reference to FIG. 8, a description will be given of the case where the refresh operation of the banks MB0–MBn is executed following the write operation or read operation of the banks MB0–MBn. In this case, the bank control signals BC0–BCn are switched from one to another for each period of the clock signal CLK.

When the bank control signal BC0 is provided to the switch circuit SW2 based on the active command ACTV for the bank MB0, the switch circuit SW2 outputs the external address signals EA0–EA9. When the address latch signal LA0 is provided to the address latch circuit AL0 under the situation, the address latch circuit AL0 latches the external address signals EA0–EA9. In this manner, the bank MB0 performs a write operation or read operation in accordance with the external address signals EA0–EA9. The bank MB0 is maintained enabled until the next active command ACTV is provided.

After one period of the clock signal CLK passes since the supply of the active command ACTV, the refresh command REF is provided and the bank control signal BC1 for the refresh operation of, for example, the bank MB1 is provided to the switch circuit SW2 in synchronism with the refresh command REF. Then, based on the refresh command REF, the refresh request signal RQ1 is provided to the refresh address counter RC1 and the OR gate 1a.

In response to the refresh request signal RQ1, the refresh address counter RC1 supplies the refresh address signals RA10–RA19 to the switch circuit SW2 and the OR gate 1a supplies the refresh request signal RQ to the switch circuit SW2. In response to the refresh request signal RQ, the switch circuit SW2 outputs the refresh address signals RA10–RA19.

When the address latch signal LA1 is provided to the address latch circuit AL1, the address latch circuit AL1 latches the refresh address signals RA10–RA19. In this manner, the bank MB1 performs a refresh operation in accordance with the refresh address signals RA10–RA19.

When the bank MB0 is selected based on the next active command ACTV, the bank MB0 performs a write operation or read operation in accordance with the external address signals EA0–EA9. When the refresh command REF is provided after one period of the clock signal CLK passes since the supply of the active command ACTV, and the bank MB1 is selected, the bank MB1 performs a refresh operation in accordance with the refresh address signals RA10–RA19.

The SDRAM 300 has the following advantages.

(1) The supply of the active command ACTV allows an arbitrary one of the plural banks MB0–MBn to perform a write operation and read operation according to the external address signals EA0–EA9.

(2) The supply of the refresh command REF allows an arbitrary one of plural banks MB0–MBn to perform a refresh operation according to the refresh address signals that are generated by the associated one of the refresh address counters RC0–RCn.

(3) The switch circuit SW2 supplies the common address signals GA0–GA9 to the address latch circuits AL0–ALn associated with the banks MB0–MBn. Even if the number of banks is increased, an increase in the interconnection layout area for the common address signals GA0–GA9 is prevented. This suppresses an increase in the area of the SDRAM 300.

(4) With regard to the refresh operation, an arbitrary bank can be designated. Selecting a bank which is less accessed for a write operation or read operation and performing a refresh operation on that bank eliminates a wasteful refresh operation, thus reducing the power consumption.

(5) Because the refresh operations of a plurality of banks are not executed simultaneously, the peak of the consumed current becomes lower. This permits the power lines to have a narrower width and thus contributes to reducing the area of the SDRAM 300.

Figure 9:
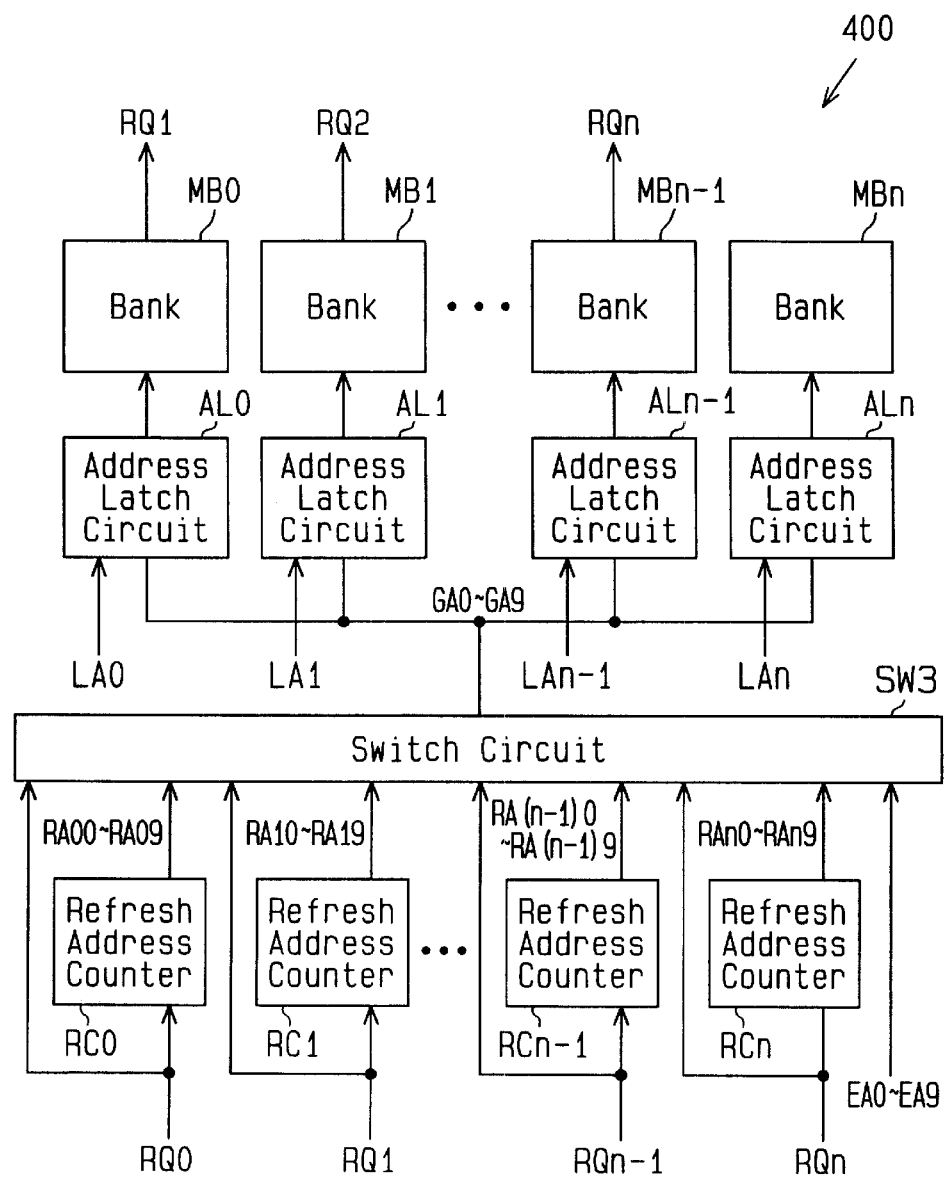
FIG. 9 is a schematic block diagram of an SDRAM according to a third embodiment of the present invention.

An SDRAM 400 according to a third embodiment of the present invention will now be discussed by referring to FIGS. 9 through 11.

In the third embodiment, a switch circuit SW3 selects a refresh address signal to sequentially refresh a plurality of banks MB0–MBn in accordance with refresh request signals provided to the respective refresh address counters.

The refresh request signals RQ0–RQn are provided to the refresh address counters RC0–RCn as well as the switch circuit SW3.

Figure 10:
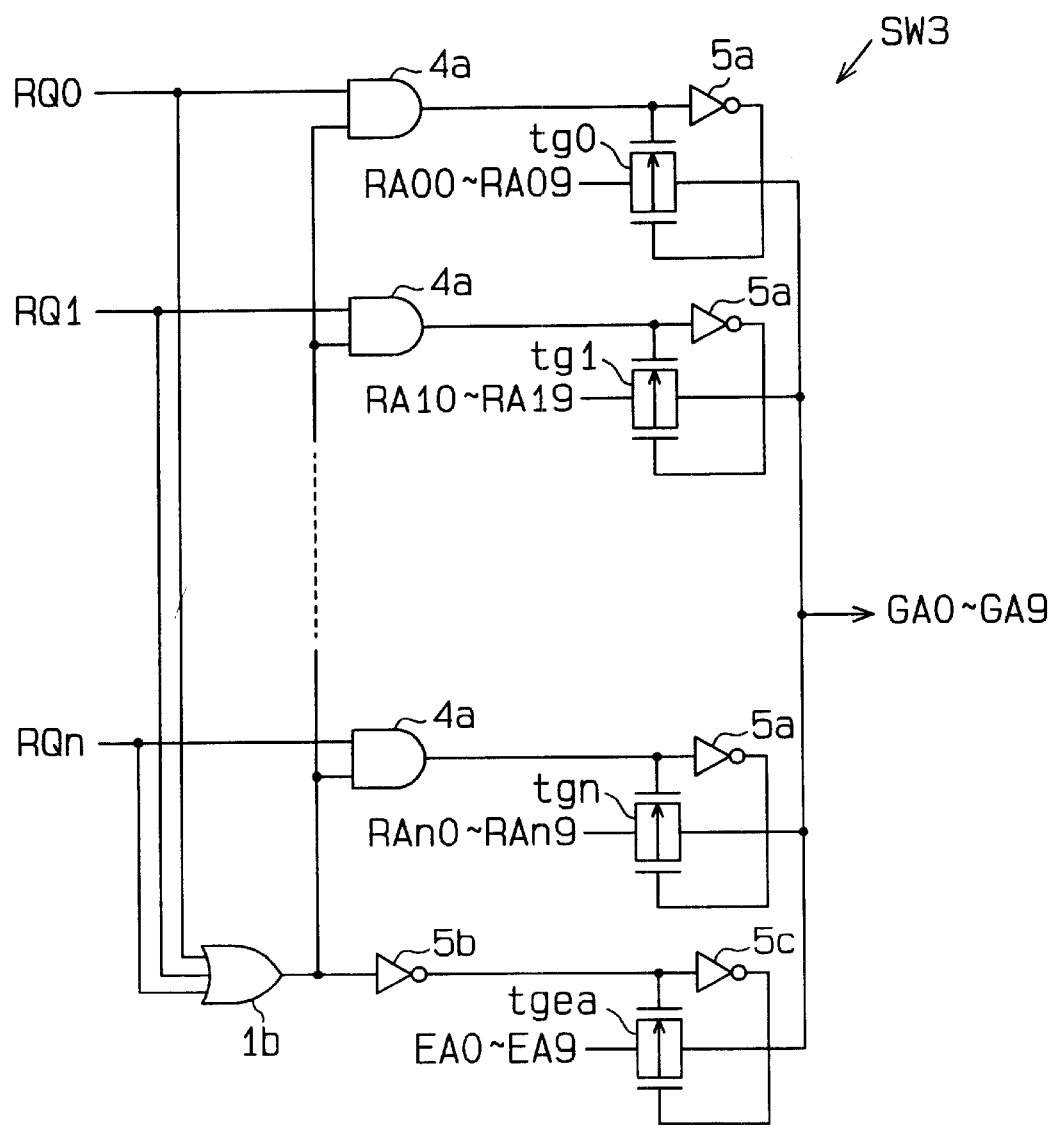
FIG. 10 is a schematic circuit diagram of a switch circuit of the SDRAM of FIG. 9.

As shown in FIG. 10, the switch circuit SW3 includes an OR gate 1b which receives the refresh request signals RQ0–RQn and a plurality of AND gates 4a which receive an OR logic output signal from the OR gate 1b and the associated refresh request signals.

The OR logic output signal of the OR gate 1b is also provided to the inverter circuit 5b.

When one of the refresh request signals RQ0–RQn rises to a high level in refresh mode, the OR logic output signal of the OR gate 1b rises to a high level. As a result, that AND gate 4a, which receives a high-level refresh request signal, outputs a high-level AND signal, thereby enabling the associated transfer gate.

Therefore, the switch circuit SW3 outputs, as the common address signals GA0–GA9, refresh address signals provided from that refresh address counter which receives the high-level refresh request signal.

When all of the refresh request signals RQ0–RQn have low levels, the OR logic output signal of the OR gate 1b has a low level, so that only the transfer gate tgea is enabled. As a result, the external address signals EA0–EA9 are output as the common address signals GA0–GA9.

Each of the banks MB0–MBn outputs a refresh request signal to refresh the bank at the subsequent stage when that bank completes a refresh operation according to the refresh address signals provided from the associated one of the refresh address counters RC0–RCn.

Specifically, when the refresh operation of the bank MB0 is completed, the bank MB0 outputs the refresh request signal RQ1 for the bank MB1. When the refresh operation of the bank MB1 is completed, the bank MB1 outputs the refresh request signal RQ2 for the bank MB2. When the refresh operation of the bank MBn-1 is completed, the bank MBn-1 outputs the refresh request signal RQn for the bank MBn.

When the active command ACTV is provided, the SDRAM 400 operates in the same way as the SDRAM 300 of the second embodiment.

Figure 11:
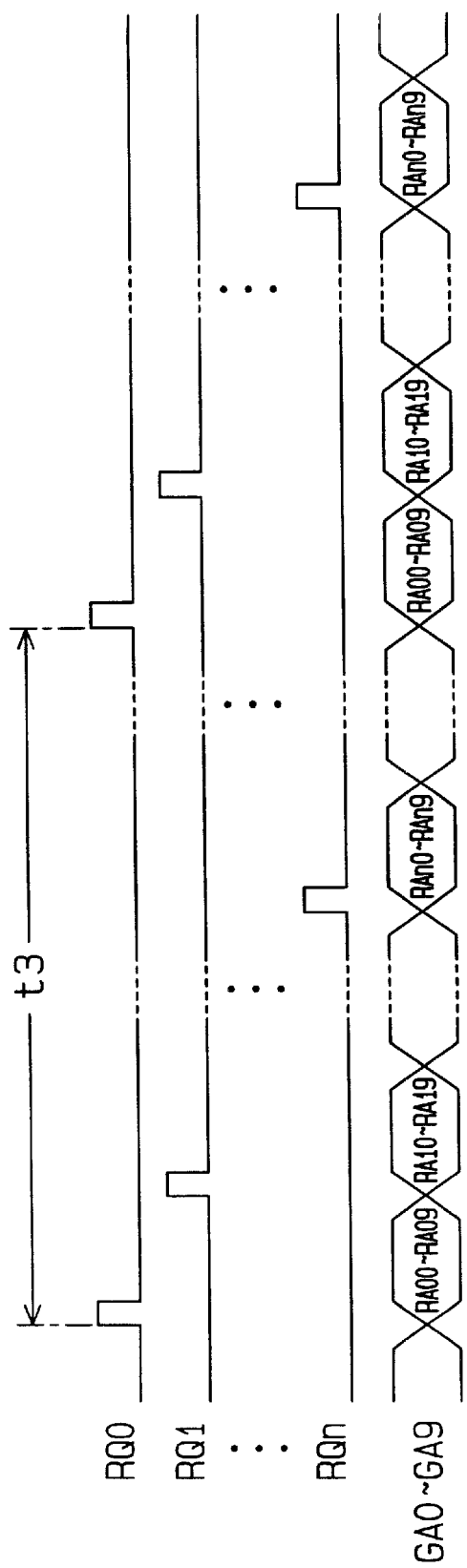
FIG. 11 is a timing waveform chart illustrating the operation of the SDRAM of FIG. 9.

When the first refresh request signal RQ0 is provided to the refresh address counter RC0 and the switch circuit SW3 based on a self-refresh entry command, the switch circuit SW3 outputs the refresh address signals RA00–RA09 provided from the refresh address counter RC0 as shown in FIG. 11.

Next, the address latch circuit AL0 latches the refresh address signals RA00–RA09 in response to the address latch signal LA0. The bank MB0 performs a refresh operation in accordance with the refresh address signals RA00–RA09.

When the refresh operation is completed, the bank MB0 provides the refresh request signal RQ1 to the refresh address counter RC1 and the switch circuit SW3. Then, the switch circuit SW3 outputs the refresh address signals RA10–RA19 provided from the refresh address counter RC1. In accordance with the refresh address signals RA10–RA19, the bank MB1 performs a refresh operation. When this refresh operation is completed, the bank MB1 outputs the refresh request signal RQ2.

Such a sequence of operations is repeated so that the banks MB0–MBn sequentially perform refresh operations in accordance with the refresh address signals provided from the associated refresh address counters RC0–RCn.

After the refresh operation of the bank MBn is finished, the bank MBn provides the first refresh request signal RQ0 to the refresh address counter RC0 and the switch circuit SW3 after a time t3 preset by an internal timer passes.

The SDRAM 400 of the third embodiment performs a refresh operation bank by bank based on the self-refresh command.

An SDRAM 500 according to a fourth embodiment of the present invention will now be discussed with reference to FIG. 12. The SDRAM 500 includes a bank address counter 6 and AND gates 4b for performing a refresh operation bank by bank every time the refresh request signal RQ is provided. According to the fourth embodiment, therefore, the banks MB0–MBn-1 do not output the refresh request signals RQ0–RQn.

The refresh request signal RQ is provided to the bank address counter 6 and the AND gates 4b associated with the refresh address counters RC0–RCn.

AND logic output signals from the AND gates 4b are provided to the refresh address counters RC0–RCn and the switch circuit SW3 as the refresh request signals RQ0–RQn.

Every time the bank address counter 6 receives the refresh request signal RQ, the bank address counter 6 performs a count-up operation to generate a bank address BAj and provides the bank address BAj to each AND gate 4b.

Figure 12:
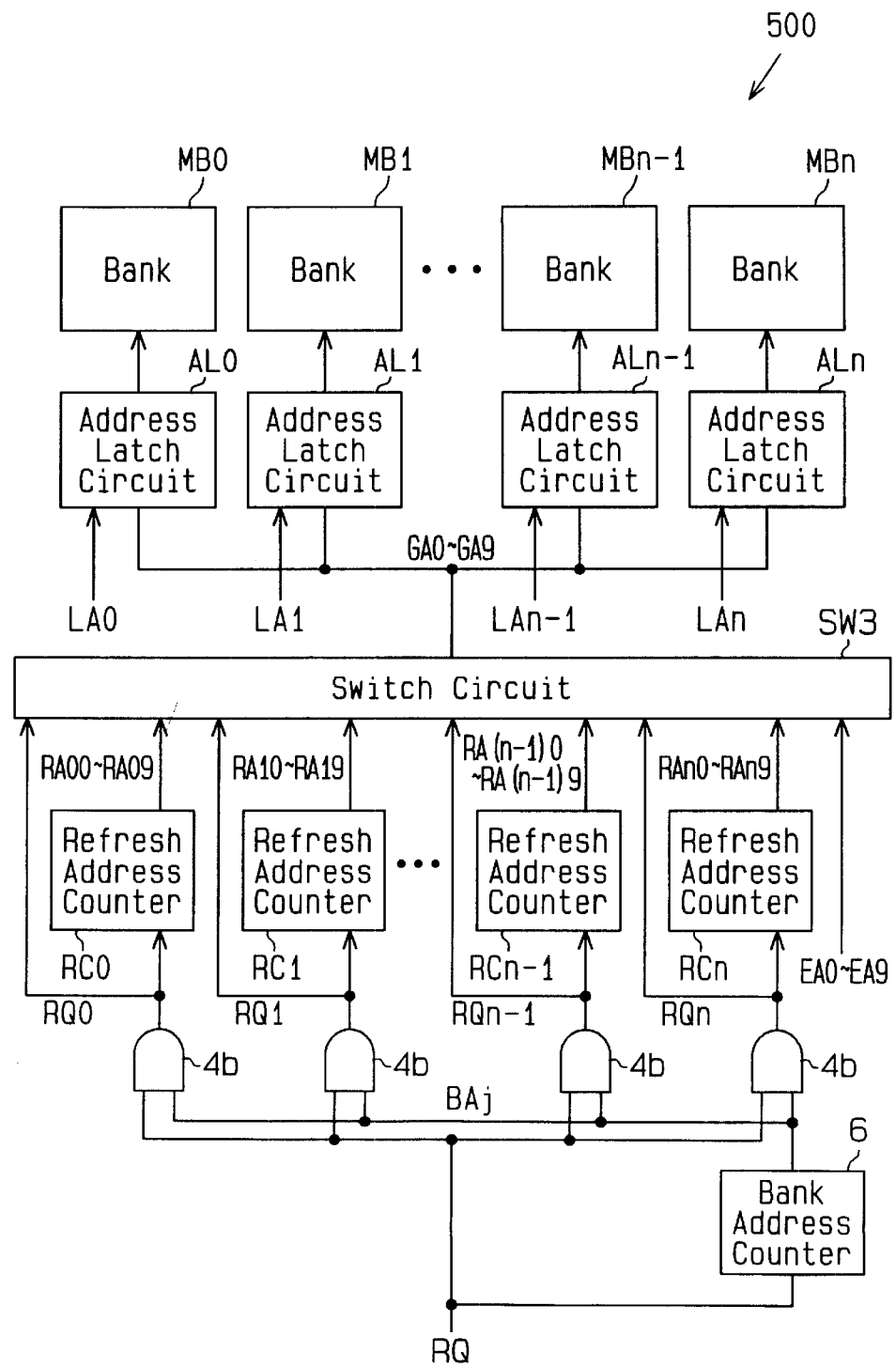
FIG. 12 is a schematic block diagram of an SDRAM according to a fourth embodiment of the present invention.

The bank address BAj is illustrated in FIG. 12 in such a way as to be provided to each AND gate 4b over a single signal line. When there are, for example, eight banks, however, a 3-bit bank address for selecting a single bank is provided to each AND gate 4b from the bank address counter 6.

When the bank MB0 is selected, for example, all of the bits of the bank address BAj provided to the AND gate 4b associated with the refresh address counter RC0 rise to high levels. When the bank MB1 is selected, a specific bit in the bank address BAj provided to the AND gate 4b associated with the refresh address counter RC1 is inverted at the inversion input terminal of that AND gate 4b so that all of the bits of the bank address BAj rise to high levels.

When the active command ACTV is provided, the SDRAM 500 operates in the same way as the SDRAM of the second embodiment.

In refresh mode, every time the refresh request signal RQ is provided, the refresh request signals RQ0–RQn are sequentially provided to the refresh address counters RC0–RCn and the switch circuit SW3. Then, the switch circuit SW3 sequentially outputs the refresh address signals of the refresh address counters RC0–RCn. The address latch circuits AL0–ALn sequentially latch the refresh address signals and the banks MB0–MBn sequentially perform a refresh operation.

The SDRAM 500 executes a refresh operation on the banks MB0–MBn, one by one, based on a single refresh request signal RQ provided.

Figure 13:
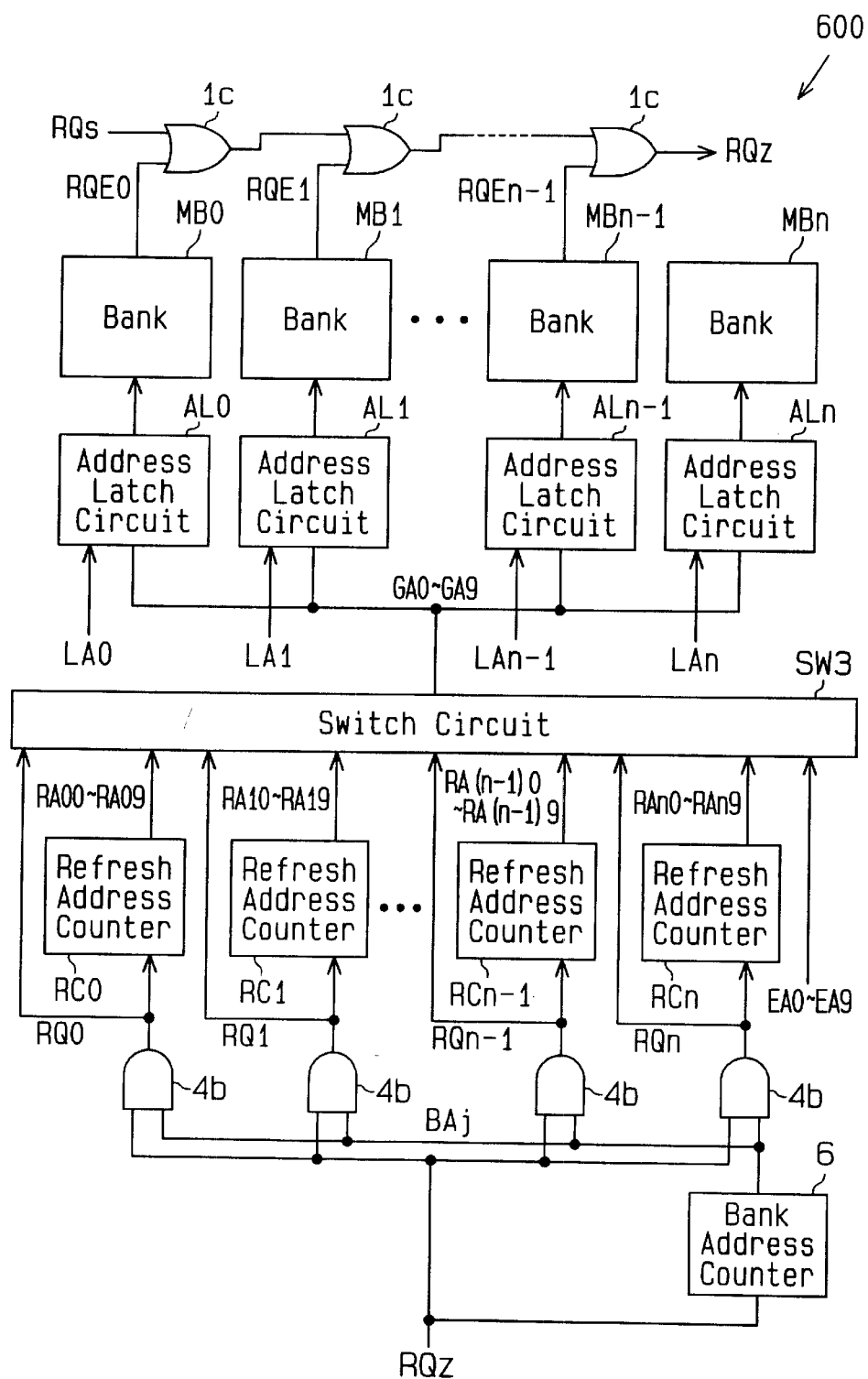
FIG. 13 is a schematic block diagram of an SDRAM according to a fifth embodiment of the present invention.

FIG. 13 is a schematic block diagram of an SDRAM 600 according to a fifth embodiment of the present invention. The SDRAM 600 is the combination of the third embodiment and the fourth embodiment.

When a refresh operation according to the refresh address signal latched in each of the address latch circuits AL0–ALn is finished, each of the banks MB0–MBn generates the associated one of refresh-end signals RQE0 to RQEn which are high-level one-shot pulse signals.

The refresh-end signals RQE0–RQEn are respectively provided to OR gates 1c associated with the banks MB0–MBn. The OR output signal of the OR gate 1c associated with the bank MB0 is provided to the OR gate 1c associated with the bank MB1. That is, the OR logic output signal of the OR gate 1c associated with the n-th bank is provided to the OR gate 1c associated with the (n+1)-th bank.

A refresh request signal RQs is provided to the OR gate 1c associated with the bank MB0. The refresh request signal RQs is a high-level one-shot pulse signal provided at a given period in response to a self-refresh command.

The OR logic output signal of the OR gate 1c associated with the bank MBn-1 is provided as a refresh request signal RQz to the bank address counter 6 and each AND gate 4b.

When the active command ACTV is provided, the SDRAM 600 operates in the same way as the SDRAM of each embodiment.

Figure 14:
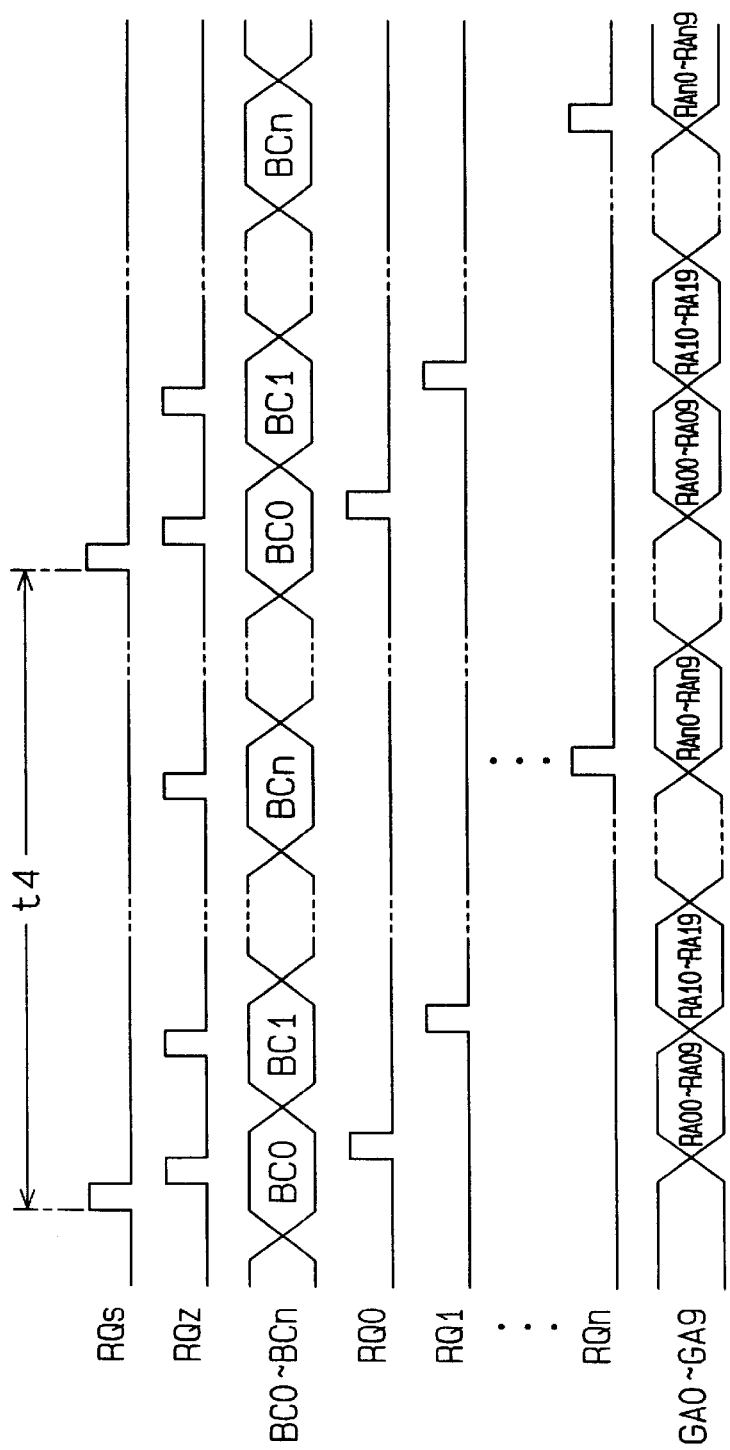
FIG. 14 is a timing waveform chart illustrating the operation of the SDRAM of FIG. 13.

When the refresh request signal RQs is provided to the OR gate 1c based on supplying the self-refresh entry command, as shown in FIG. 14, the refresh request signal RQz is provided to each AND gate 4b and the bank address counter 6 via the individual OR gates 1c. Then, the bank address counter 6 outputs the bank address BAj for selecting the bank MB0, and the AND gate 4b associated with the bank MB0 provides the refresh request signal RQ0 to the refresh address counter RC0 and the switch circuit SW3. Then, the switch circuit SW3 outputs the refresh address signals RA00–RA09 of the refresh address counter RC0. The address latch circuit AL0 latches the refresh address signals RA00–RA09 in response to the address latch signal LA0.

The bank MB0 performs a refresh operation in accordance with the refresh address signals RA00–RA09. When the refresh operation is completed, the bank MB0 provides the refresh-end signal RQE0 to the associated OR gate 1c and the last OR gate 1c provides the refresh request signal RQz to each AND gate 4b and the bank address counter 6. Then, the bank address counter 6 outputs the bank address BAj for selecting the bank MB1, and the AND gate 4b associated with the bank MB1 provides the refresh request signal RQ1 to the refresh address counter RC1 and the switch circuit SW3. Then, the switch circuit SW3 outputs the refresh address signals RA10–RA19 of the refresh address counter RC1. The address latch circuit AL1 latches the refresh address signals RA10–RA19 in response to the address latch signal LA1. Next, the bank MB1 performs a refresh operation in accordance with the refresh address signals RA10–RA19. When the refresh operation is completed, the bank MB1 outputs the refresh-end signal RQE1. Such a sequence of operations is repeated so that the banks MB0–MBn sequentially perform refresh operations. After a time t4 preset by the internal timer passes since the end of the refresh operation of the bank MBn, the refresh request signal RQs is provided again and the above-described sequence of operations is repeated.

The SDRAM 600 performs sequentially a refresh operation bank by bank with respect to the banks MB0–MBn based on the self-refresh command.

Figure 15:
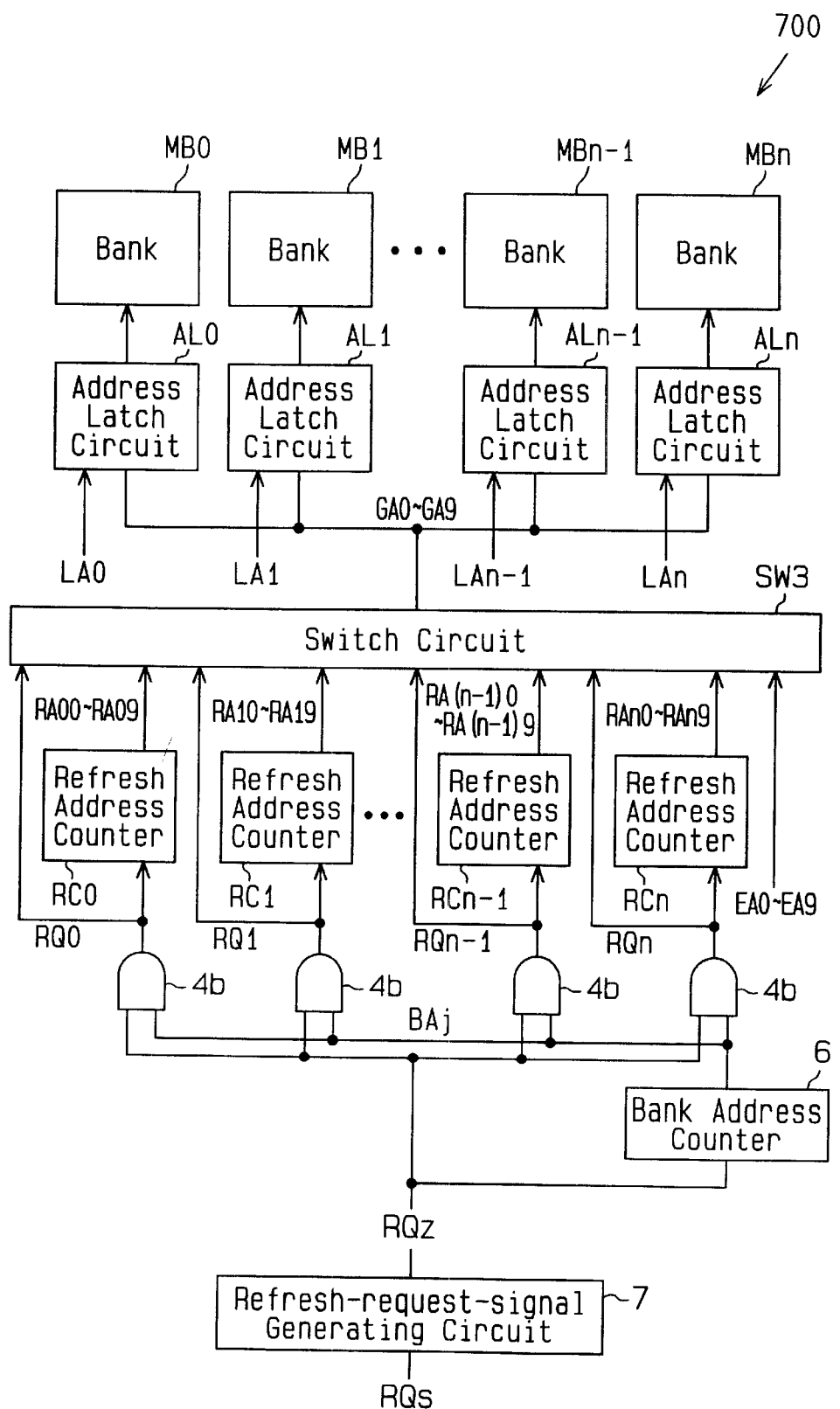
FIG. 15 is a schematic block diagram of an SDRAM according to a sixth embodiment of the present invention.

FIG. 15 is a schematic block diagram of an SDRAM 700 according to a sixth embodiment of the present invention. The SDRAM 700 includes a refresh-request-signal generating circuit 7 which generates the refresh request signal RQz corresponding to each bank from the refresh request signal RQs that is provided at a given period based on the self-refresh command.

The refresh-request-signal generating circuit 7 sequentially generates the refresh request signals RQz corresponding in number to the banks MB0–MBn using the refresh request signal RQs.

Figure 16:
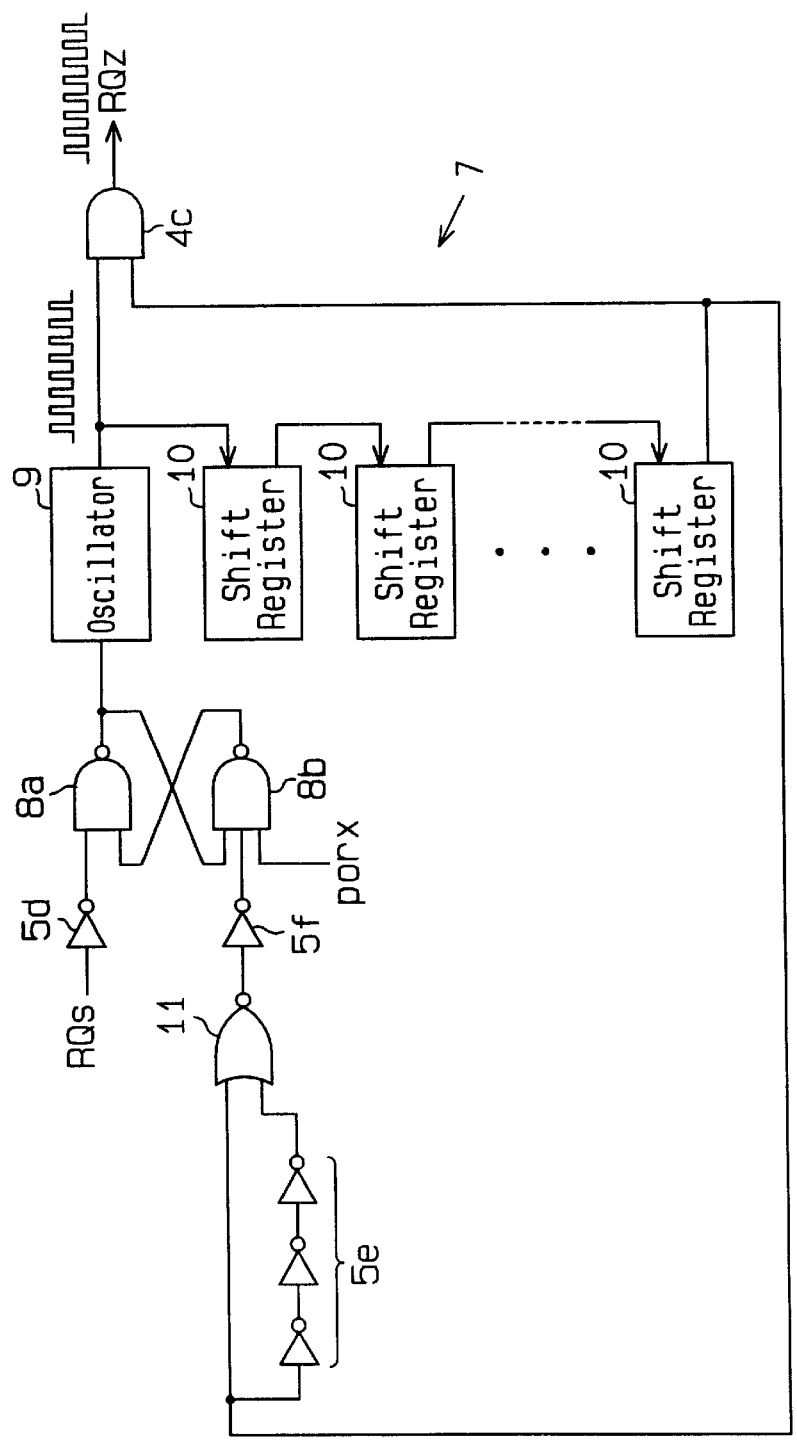
FIG. 16 is a schematic circuit diagram of a refresh-request-signal generating circuit of the SDRAM of FIG. 15.

FIG. 16 is a schematic circuit diagram of the refresh-request-signal generating circuit 7. The refresh request signal RQs is provided to the first input terminal of a NAND gate 8a via an inverter circuit 5d. The NAND logic output signal of the NAND gate 8a is provided to an oscillator 9 and the first input terminal of a NAND gate 8b.

When the NAND logic output signal rises to a high level, the oscillator 9 is enabled and oscillates at a predetermined frequency to generate an oscillation output signal. The oscillation output signal is provided to the first input terminal of an AND gate 4c and the first one of series-connected m shift registers 10. The output signal of the last shift register 10 is provided to the second input terminal of the AND gate 4c, which outputs the refresh request signal RQz.

The output signal of the last shift register 10 is also provided to the first input terminal of a NOR gate 11 directly and to the second input terminal of the NOR gate 11 via three inverter circuits 5e. The NOR logic output signal of the NOR gate 11 is provided to the second input terminal of the NAND gate 8b via an inverter circuit 5f. A power-on reset signal porx is provided to the third input terminal of the NAND gate 8b whose NAND logic output signal is provided to the second input terminal of the NAND gate 8a.

At the time power is provided to the refresh-request-signal generating circuit 7, the power-on reset signal porx is maintained at a low level for a predetermined time and then rises to a high level, causing the NAND logic output signal of the NAND gate 8b to rise to a high level. Because the input signal to the inverter circuit 5d is maintained at a low level at this time, the inverter circuit 5d outputs a high-level signal so that the NAND gate 8a outputs a low-level logic output signal. Therefore, the oscillator does not generate an oscillation output signal.

When the high-level one-shot pulse signal RQs is provided under this situation, the NAND gate 8a outputs a high-level NAND logic output signal and the NAND gate 8b outputs a low-level NAND logic output signal, so that the NAND logic output signal of the NAND gate 8a is latched to a high level.

Then, the oscillator 9 generates the oscillation output signal and the m shift registers 10 start frequency-dividing the oscillation output signal. Specifically, the output signal of each shift register 10 rises in synchrony with the first rising of the oscillation output signal of the oscillator 9 and the output signal of the last shift register 10 falls to a low level after the oscillation output signal of the oscillator 9 is frequency-divided by $2^{m-1}$.

When the output signal of the last shift register 10 falls to a low level, the inverter circuit 5f outputs a low-level one-shot pulse signal based on the operational delay time of the inverter circuit 5e. This resets the NAND logic output signal of the NAND gate 8b to a high level and resets the NAND logic output signal of the NAND gate 8a to a low level. As a result, the oscillator 9 stops the oscillation operation.

In the refresh-request-signal generating circuit 7, when a single refresh request signal RQs is provided, the AND gate 4c outputs the oscillation output signal of the oscillator 9 as the refresh request signal RQz $2^{m-1}$ times. The number of the refresh request signals RQz, $2^{m-1}$, is set to a value enough to refresh all of the banks MB0–MBn.

When the active command ACTV is provided, the SDRAM 700 operates in the same way as the SDRAM of the second embodiment.

When the refresh request signal RQs is provided to the refresh-request-signal generating circuit 7, the refresh-request-signal generating circuit 7 sequentially outputs the refresh request signal RQz. Every time the refresh request signal RQz is output, the refresh request signals RQ0–RQn are sequentially provided to the refresh address counters RC0–RCn and the switch circuit SW3. Then, the switch circuit SW3 sequentially outputs the refresh address signals of the refresh address counters RC0–RCn. The address latch circuits AL0–ALn sequentially latch the associated refresh address signals and the banks MB0–MBn sequentially perform a refresh operation.

In the SDRAM 700, the refresh-request-signal generating circuit 7 generates the refresh request signals RQz from the refresh request signal RQs and the banks MB0–MBn perform a refresh operation one by one.

It should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope and equivalence of the appended claims.

What is claimed is:

1. A semiconductor memory device comprising:
   a plurality of banks for each performing a write operation and read operation according to an external address signal and a refresh operation according to a refresh address signal;
   a plurality of refresh address counters for generating a plurality of refresh address signals associated with the plurality of banks in response to a refresh request signal;
   a switch circuit, connected to the plurality of refresh address counters, for selectively outputting the external address signal and a refresh address signal generated by one of the plurality of refresh address counters in accordance with the refresh request signal; and
   a plurality of address holding circuits, connected between the switch circuit and the plurality of banks, for each holding one of the refresh address signal and the external address signal output from the switch circuit and supplying the held address signal to an associated one of the banks.

2. The semiconductor memory device according to claim 1, wherein the switch circuit supplies the plurality of refresh address signals in a time-divisional manner, and each of the address holding circuits holds the time-divisionally provided refresh address signal which is to be provided to an associated bank.

3. The semiconductor memory device according to claim 1, wherein the switch circuit selects a refresh address signal from the plurality of refresh address signals which is associated with a bank to be refreshed in accordance with a bank control signal.

4. The semiconductor memory device according to claim 1, wherein the switch circuit selects a refresh address signal from the plurality of refresh address signals which is associated with a bank to be refreshed in accordance with the refresh request signal.

5. The semiconductor memory device according to claim 4, wherein the refresh request signal is one of a plurality of refresh request signals associated with the plurality of banks; and the semiconductor memory device further comprises a logic circuit, connected to the switch circuit, for supplying one of the refresh request signals to the switch circuit.

6. The semiconductor memory device according to claim 4, wherein each of the banks generates a refresh request signal for a next adjoining one of the banks when a refresh operation according to the refresh address signal is completed.

7. The semiconductor memory device according to claim 1, further comprising:

a bank address counter for receiving the refresh request signal and generating a bank address signal for a bank to be refreshed; and a plurality of logic circuits, connected between the bank address counter and the plurality of refresh address counters, for each supplying the refresh request signal to an associated one of the refresh address counters in accordance with the bank address signal.

8. The semiconductor memory device according to claim 7, further comprising:

a refresh-request-signal generating circuit, connected to the bank address counter and the plurality of logic circuits, for receiving an original refresh request signal based on a self-refresh command and generating a plurality of refresh request signals associated with the plurality of banks.

9. The semiconductor memory device according to claim 1, wherein each of the banks generates a refresh-end signal when a refresh operation according to the refresh address signal is completed, and the semiconductor memory device further comprises:

a bank address counter for receiving the refresh-end signal and generating a bank address signal to designate a bank to be refreshed; and a plurality of logic circuits, connected between the bank address counter and the plurality of refresh address counters, for each supplying the refresh request signal to an associated one of the refresh address counters in accordance with the bank address signal.

10. A method of refreshing a semiconductor memory device having a plurality of banks, comprising the steps of:

generating a plurality of refresh address signals associated with the plurality of banks;

supplying the plurality of refresh address signals in a time-divisional manner;

holding a refresh address signal to be provided to an associated one of the banks; and refreshing the associated one of the banks in accordance with the held refresh address signal.

11. The method according to claim 10, wherein the step of generating the plurality of refresh address signals includes generating the plurality of refresh address signals in order in response to a refresh request signal; and the method further comprises the step of, when refreshing of each of the banks is finished, generating a refresh request signal for a next adjoining bank.

12. The method according to claim 10, wherein the step of generating the plurality of refresh address signals includes generating the plurality of refresh address signals in order in response to a refresh request signal; and the method further comprises the step of sequentially generating a plurality of refresh request signals associated with the plurality of banks from the refresh request signal.

13. A method of refreshing a semiconductor memory device having a plurality of banks, comprising the steps of:

providing a bank control signal, which designates a bank to be refreshed, in synchronism with a refresh command;

selecting one of the plurality of banks in accordance with the bank control signal; and refreshing the selected bank.

14. The method according to claim 13, further comprising the step of generating the bank address signal using a refresh request signal.

15. A method of refreshing a semiconductor memory device having a plurality of banks, comprising the steps of:

generating a bank address signal which designates a bank to be refreshed, by using a refresh request signal;

selecting one of the plurality of banks in accordance with the bank address signal;

generating a refresh address signal corresponding to the selected bank;

supplying the refresh address signal onto a single signal line;

holding the refresh address signal; and refreshing the selected bank in accordance with the held refresh address signal.

* * * * *